(12) United States Patent
Yang et al.

(10) Patent No.: US 7,750,341 B2
(45) Date of Patent: Jul. 6, 2010

(54) BISTABLE NANOPARTICLE-POLYMER COMPOSITE FOR USE IN MEMORY DEVICES

(75) Inventors: Yang Yang, Los Angeles, CA (US); Jianyong Ouyang, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 788 days.

(21) Appl. No.: 11/596,585

(22) PCT Filed: May 12, 2005

(86) PCT No.: PCT/US2005/016741

§ 371 (c)(1),
(2), (4) Date: Nov. 15, 2006

(87) PCT Pub. No.: WO2006/001923

PCT Pub. Date: Jan. 5, 2006

(65) Prior Publication Data

US 2007/0281150 A1    Dec. 6, 2007

Related U.S. Application Data

(60) Provisional application No. 60/572,145, filed on May 17, 2004.

(51) Int. Cl.
*H01L 51/30*    (2006.01)
(52) U.S. Cl. .......... 257/40; 257/E51.011; 257/E51.025; 257/E51.028; 977/774; 977/779; 977/783; 977/810; 977/943

(58) Field of Classification Search ................... 257/40, 257/E51.008, E51.011, E51.025, E51.027, 257/E51.028; 365/151, 153; 977/773, 774, 977/778, 779, 783, 784, 785, 810, 943
See application file for complete search history.

(56) References Cited

U.S. PATENT DOCUMENTS 3,719,933 A    3/1973    Wakabayashi et al.
3,833,894 A    9/1974    Aviram et al.

(Continued)

FOREIGN PATENT DOCUMENTS

WO    WO 01/71814 A1    9/2001

(Continued)

OTHER PUBLICATIONS

The Electrochemical Society—Current Affairs—Abstracts of "Recent News" Papers, Presented at Electronics Division Semiconductor Symposia, Los Angeles, CA (1962).

(Continued)

*Primary Examiner*—Anh Phung
*Assistant Examiner*—Michael Lulis
(74) *Attorney, Agent, or Firm*—Venable LLP; Henry J. Daley

(57) ABSTRACT

An electrically bistable body for use in electronic devices wherein the bistable body is converted from a low conductivity state to a high conductivity state. The bistable body includes a polymer matrix in which a sufficient amount of capped nanoparticles are dispersed so that the bistable body is converted from a low conductivity state to a high conductivity state upon application of an electrical field. The capped nanoparticles are metal nanoparticles that have been coated with an aromatic thiol.

10 Claims, 5 Drawing Sheets

U.S. PATENT DOCUMENTS

| | | | |
|---|---|---|---|
| 4,144,418 | A | 3/1979 | Girard et al. |
| 4,371,883 | A | 2/1983 | Potember et al. |
| 4,507,672 | A | 3/1985 | Potember et al. |
| 4,652,894 | A | 3/1987 | Potember et al. |
| 4,663,270 | A | 5/1987 | Potember et al. |
| 4,987,023 | A | 1/1991 | Sato et al. |
| 5,075,738 | A | 12/1991 | Matsuda et al. |
| 5,136,212 | A | 8/1992 | Eguchi et al. |
| 5,238,607 | A | 8/1993 | Herron et al. |
| 5,543,631 | A | 8/1996 | Weinberger |
| 5,563,424 | A | 10/1996 | Yang et al. |
| 5,569,565 | A | 10/1996 | Kawakami et al. |
| 5,610,898 | A | 3/1997 | Takimoto et al. |
| 5,761,115 | A | 6/1998 | Kozicki et al. |
| 6,015,631 | A | 1/2000 | Park |
| 6,055,180 | A | 4/2000 | Gudesen et al. |
| 6,122,031 | A | 9/2000 | Terada et al. |
| 6,208,553 | B1 | 3/2001 | Gryko et al. |
| 6,229,047 | B1 | 5/2001 | Glaser et al. |
| 6,600,473 | B1 | 7/2003 | Kobayashi et al. |
| 6,631,085 | B2 | 10/2003 | Kleveland et al. |
| 6,774,880 | B2 | 8/2004 | Kobayashi |
| 6,828,685 | B2 | 12/2004 | Stasiak |
| 6,852,555 | B1 | 2/2005 | Roman et al. |
| 6,950,331 | B2 | 9/2005 | Yang et al. |
| 2002/0010261 | A1 | 1/2002 | Callahan et al. |
| 2002/0031602 | A1 | 3/2002 | Zhang |
| 2002/0163828 | A1 | 11/2002 | Krieger et al. |
| 2002/0163831 | A1 | 11/2002 | Krieger et al. |
| 2002/0195600 | A1 | 12/2002 | Leuschner |
| 2003/0053350 | A1 | 3/2003 | Krieger et al. |
| 2003/0063362 | A1 | 4/2003 | Demir et al. |
| 2003/0155602 | A1 | 8/2003 | Krieger et al. |
| 2003/0173612 | A1 | 9/2003 | Krieger et al. |
| 2003/0178667 | A1 | 9/2003 | Krieger et al. |
| 2003/0179633 | A1 | 9/2003 | Krieger et al. |
| 2004/0026714 | A1 | 2/2004 | Krieger et al. |
| 2004/0159835 | A1 | 8/2004 | Krieger et al. |
| 2004/0160801 | A1 | 8/2004 | Krieger et al. |
| 2004/0246768 | A1 | 12/2004 | Krieger et al. |
| 2005/0111071 | A1 | 5/2005 | Kojima et al. |

FOREIGN PATENT DOCUMENTS

| | | |
|---|---|---|
| WO | WO 02/37500 A1 | 5/2002 |
| WO | WO 02/091496 A2 | 11/2002 |
| WO | WO 2004/064074 | 7/2004 |

OTHER PUBLICATIONS

Ovshinsky, S.R., "Localized States in the Gap of Amorphous Semiconductors", Phys. Rev. Lett., vol. 36 (No. 24), Jun. 14, 1976, p. 1469-1472.

Y. G. Kriger, N.F. Yudanov, I.K. Igumenov, and S.B. Vashchenko, J. Struct. Chem. 34, 966 (1993).

Hovel, H.J. And J.J. Urgell, "Switching and Memory Characteristics of ZnSe—Ge Heterojunctions", J. Appl. Phys. 42, 5076 (1971).

Kumai, R., Y. Okimoto and Y. Tokura, "Current-Induced Insulator-Metal Transition and Pattern Formation in an Organic Charge-Transfer Complex", Science 284, 1645 (1999).

Garnier, F., R. Hajlaoui, A. Yassar and P. Shirakawa, "All-Polymer Field-Effect Transistor Realized by Printing Techniques", Science 265, 1684 (1994).

Hide, F., M.A. Diaz-Garcia, B.J. Schwartz, M.R.A. Andersson, Q. Pei and A.J. Heeger, Science 273, 1833 (1996).

Fujita, W. and K. Awaga, "Room-Temperature Magnetic Bistability in Organic Radical Crystals", Science, vol. 286 p. 261 (1999).

Burroughes, J.H., D.D.C. Bradley, A.R. Brown, R.N. Marks, K. Mackay, R.H. Friend, P.L. Burn and A.B. Holmes, "Light-Emitting Diodes Based on Conjugated Polymers" Nature vol. 347, p. 539 (1990).

Yamada, T., D. Zou, H. Jeong, Y. Akaki and T. Tsutsui, "Recoverable Degradation and Internal Field Forming Process Accompanied by the Orientation of Dipoles in Organic Light Emitting Diodes", Synthetic Metals, 111-112, 237 (2000).

Liu, J., Y. Shi, L.P. Ma and Y. Yang, "Device Performance and Polymer Morphology in Polymer Light Emitting Diodes: The Control of Device Electrical Properties and Metal/Polymer Contact", J. Appl. Phys. 88, 605 (2000).

Hamada, Y., C. Adachi, T. Tsutsui and S. Saito, "Blue-Light-Emitting Organic Electroluminescent Devices with Oxadiazole Dimer Dyes as an Emitter", Jpn. J. Appl. Phys. 31, 1812 (1992).

Silva, et al., Bistable Switching and Memory Devices; Journal of non-Crystalline Solids; (1970) oo, 316-333 No. Holland Publishing Co., Amsterdam.

Bozano, et al; Mechanism for Bistability in Organic Memory Elements; Applied Physics Letters, (2004); vol. 84, No. 4, pp. 607-609; 2004 American Institute of Physics.

Hua, et al.; New Organic Bistable Films for Ultrafast Electric Memories; Applied Surface Science, 169-170 (20010 pp. 447-451,Elsevier Science B.V.

Beinhoff, et al., Poybiphenymethylenes: New Polymers for Bistable Organic Switches; Polymeric Materials: Science and Engineering 90, (2004) 211, 212, U.S.

Sezi, et al.; Organic Materials for High-Density NonVolatile Memory Applications; Proc. IEEE Int. Elec. Dev. Meeting; (2003); Germany.

Kevorkian, et al.; bistable Switching in Organic Thin Films; Discussions of the Faraday Society, 51, (1971) pp. 139-142; U.S.

Pei, Qibing et al., Polymer Light-Emitting Electrochemical Cells, Science, New Series, vol. 269, No. 5227 (Aug. 25, 1995), pp. 1086-1088.

Kolega et al., Langmuir 1998, vol. 14, p. 5469-5478.

Schlaf et al., "Photoemission Spectrocscopy of LiF Coated Al and Pt Electrodes", Journal of Applied Physics, vol. 84, No. 12, pp. 6729-6736.

Beeler, F., O.K. Andersen and M. Scheffler", Theoretical Evidence for Low-Spin Ground States of Early Interstitial and Late Substitutional 3d Transition-Metal Ions in Silicon", Phys. Rew. Lett. 55, 1498 (1985).

Boyd, G.D., J. Cheng and P.D.T. Ngo, "Liquid-Crystal Orientational Bistability and Nematic Storage Effects", Appl. Phys., Lett. 36, 556 (1980).

Brown, W.D. and J.E. Brewer, "Nonvolatile Semiconductor Memory Technology", IEEE Press, New York (1998).

Chen, J., W. Wang, M.A. Reed, A.M. Rawlett, D.W. Price and J.M. Tour, "Room-Temperature Negative Differential Resistance in Nanoscale Molecular Junctions", Appl. Phys. Lett. 77, 1224 (2000).

Dewald, J.F., A.D. Pearson, W.R. Northover and W.F. Peck, Jr., "Semi-Conducting Glasses", Electrochem. Soc., 109, 243c (1962).

Faltermeier, C., C. Goldberg, M. Jones, A. Upham, D. Manger, G. Peterson, J. Lau, A.E. Kaloyeros, B. Arkles, and A. Paranjpe, "Barrier Properties of Titanium Nitride Films Grown by Low Temperature Chemical Vapor Deposition from Titanium Tetraoidide", J. Electrochemical Society, 144, 1002 (1997).

Gruler, H. and L. Cheung, "Dielectric Alignment in an Electrically Conducting Nematic Liquid Crystal", J. Appl. Phys. 46, 5097 (1975).

Istratov, A.A. And E.R. Weber, "Physics of Copper in Silicon", J. Electrochemical Society, 149, G21 (2002).

Istratov, A.A., C. Flink, H. Hieslmair, E.R. Weber and T. Heiser, "Intrinsic Diffusion Coefficient of Interstitial Copper in Silicon", Phys. Rev. Lett. 81, 1243 (1998).

Istratov, A.A., C. Flink, H. Hieslmair, S.A. Mchugo and E.R. Weber, "Diffusion, Solubility and Gettering of Copper in Silicon", Materials Science and Engineering Technology B, 72, 99 (2000).

Kaloyeros, A.E. and E. Eisenbraun, "Ultrathin Diffusion Barriers/Liners for Gigascale Copper Metallization", Annual Rev. Materials Science, 30, 363 (2000).

Krishnamoorthy, A., K. Chanda, S.P. Murarka, G. Ramanath and J.G. Ryan, "Self-Assembled Near-Zero-Thickness Molecular Layers as Diffusion Barriers for Cu Metallization", Appl. Phys. Lett. 78, 2467 (2001).

Lane, M.W., E.G. Liniger and J.R. Lloyd, "Relationship Between Interfacial Adhesion and Electromigration in Cu Metallization", J. Appl. Phys. 93, 1417 (2003).

Lee, K.L., C.K. Hu and K.N. Tu, "In-Situ Scanning Electron Microscope Comparison Studies on Electromigration of Cu and Cu(Sn) Alloys for Advanced Chip Interconnects", J. Appl. Phys. 78, 4428-4437 (1995).

Loke, A.L.S., J.T. Wetzel, P.H. Townsend, T. Tanabe, R.N. Vrtis, M.P. Zussman, D. Kumar, C. Ryu and S.S. Wong, "Kinetics of Copper Drift in Low-Kappa Polymer Interlevel Dielectrics", IEEE Transactions on Electron Devices 46, 2178 (1999).

Ma, L.P., J. Liu and Y. Yang, "Organic Electrical Bistable Devices and Rewritable Memory Cells", Appl. Phys. Lett. 80, 2997 (2002).

Ma, L.P., J. Liu, S.M. Pyo and Y. Yang, "Organic Bistable Light-Emitting Devices", Appl. Phys. Lett. 80, 362 (2002).

Ma, L.P., J. Liu, S.M. Pyo, Q.F. Xu and Y. Yang, "Organic Bistable Devices", Mol. Cryst. Liq. Cryst. 378, 185 (2002).

Ma, L.P., S.M. Pyo, Q.F. Xu and Y. Yang, "Nonvolatile Electrical Bistability of Organic/Metal-Nanocluster/Organic System", Appl. Phys. Lett. 82, 1419 (2003).

Ma, L.P., W.J. Yang, S.S. Xie and S.J. Pang, "Ultrahigh Density Data Storage from Local Polymerization by a Scanning Tunneling Microscope", Appl. Phys. Lett. 73, 3303 (1998).

McBrayer, J.D., R.M. Swanson and T.W. Sigmon, "Diffusion of Metals in Silicon Dioxide", J. Electrochem. Soc. 133, 1242 (1986).

Nakayama, K., K. Kojima, Y. Imai, T. Kasai, S. Fukushima, A. Kitagawa, M. Kumeda, Y. Kakimoto and M. Suzuki, "Nonvolatile Memory Based on Phase Change in Se-Sb-Te Glass", J. J. Appl. Phys., Part 1, 42 (2A), 404 (2003).

Ostraat, M.L., J.W. De Blauwe, M.L. Green, L.D. Bell, M.L. Brongerma, J.R. Casperson, C. Flagan and H.A. Atwater, "Synthesis and Characterization of Aerosol Silicon Nanocrystal Nonvolatile Floating-Gate Memory Devices", Appl. Phys. Lett. 79, 433 (2001).

Patel, J.S., "Room-Temperature Switching Behavior of Ferroelectric Liquid Crystals in Thin Cells," Appl. Phys. Lett. 47, 1277 (1985).

Potember, R.S., T.O. Poehler and D.O. Cowan, "Electrical Switching and Memory Phenomena in Cu-TCNQ Thin Films", Appl. Phys. Lett. 34, 405 (1979).

Rosenberg, R., D.C. Edelstein, C.K. Hu, and K.P. Rodbell, "Copper Metallization for High Performance Silicon Technology", Annual Rev. Materials Science, 30, 229 (2000).

Segui, Y., Ai Bui and H. Carchano, "Switching in Polystyrene Films: Transition from On to Off State", J. Appl. Phys. 47, 140 (1976).

Sprang, H.A. van, and J.L. M. van de Venne, "Influence of the Surface Interaction on Threshold Values in the Cholestericnematic Phase Transition", J. Appl. Phys. 57, 175 (1985).

Wang, M.T., Y.C. Lin, and M.C. Chen, "Barrier Properties of Very Thin Ta and TaN layers Against Copper Diffusion", J. Electrochemical Society, 145, 2538 (1998).

Yang, K.H., T.C. Chieu and S. Osofsky, "Depolarization Field and Ionic Effects on the Bistability of Surface-Stabilized Ferroelectric Liquid-Crystal Devices", Appl. Phys. Lett. 55, 125 (1989).

K. Takimoto, H. Kawade, E. Kishi, K. Yano, K, Sakai, K. Hatanaka, K. Eguchi, and T. Nakagiri, Appl. Phys. Lett., 61, 3032 (1992).

H.J. Gao, K. Sohlberg, Z.Q. Xue, H.Y. Chen, S.M. Hou, L.P. Ma, X.W. Fang, X.W. Fang, S.J. Pang, and S.J. Pennycook, Phys. Rew. Lett. 84, 1780 (2000).

A. Bandyopadhyay and A.J. Pal, Appl. Phys. Lett. 82, 1215 (2003).

H.S. Majumdar, A. Bandyopadyay, A. Bolognesi, and A. J. Pal, J. Appl. Phys. 91, 2433 (2002).

D.M. Taylor and C. A. Mills, J. Appl. Phys. 90, 306 (2001).

Scheinert, S. et al., J. Appl. Phys., 92 330 (2002).

Chiang, J.C., et al., Synth. Met. 13, 193, (1986). "Polyaniline: Protonic acid doping of the emeraldine form to the metallic regime."

Huang, J., et al., J. Am. Chem. Soc., 25, 314 (2003) "Polianiline Nanofibers: Facile Synthesis and Chemical Sensors".

Virji, S., et al. Nano Lett., 4, 491 (2004). "Pollyaniline Nanofiber Gas Sensors: Examiner of Response Mechanisms".

Huang, J., et al., J. Am. Chem. Soc., 126, 851 (2004). "A General Chemical Route to Polyaniline Nanofibers".

Furukawa, T., Adv. Colloid Interface Sci., 71-72, 183 (1997). "Structure and functional properties of ferroelectric polymer".

Tsuyoshi, T., et al., App. Phys. Lett., 83, 4978 (2003). "Electrical carrier-injection and transoprt characteristics of photochromic diarylethene films".

Reed, M.A., et al., Appl. Phys. Lett., 78, 3735 (2001). "Molecular random access memory cell".

Chen, Y., et al, Appl. Phys. Lett. 82, 1610 (2003). "Nanoscale molecular-switch devices fabricated by imprint lithography".

Tang, C.W. et al., "Organic Electroluminescent Diodes", Appl. Phys. Lett. 51 (12), Sep. 21, 1987, p. 913-915.

Friend, R.H. et al., "Electroluminescence in Conjugated Polymers", Nature, vol. 397, Jan. 14, 1999, p. 121-128.

Sariciftci, N.S. et al., "Photoinduced Electron Transfer from a Conducting Polymer to Buckminsterfullerene", Science, vol. 258, Nov. 27, 1992, p. 1474-1476.

Gundlach, D.J. et al., "Pentacene Organic Thin-Film Transistors-Molecular Ordering and Mobility", IEEE Electron Device Letters, vol. 18, No. 3, Mar. 1977, p. 87-89.

Baldo, Marc et al., "Organic Vapor Phase Deposition", Adv. Mater. 1998, 10, No. 18, p. 1505-1514.

Carchano, H. et al., "Bistable Electrical Switching in Polymer Thin Films", Applied Physics Letters, vol. 19, No. 19, Nov. 15, 1971, p. 414-415.

Xu, W. et al., "Two New All-Organic Complexes with Electrical Bistable States", Appl. Phys. Lett. 67 (15), Oct. 9, 1995, p. 2241-2242.

Ma, L.P. et al., "Data Storage with 0.7 nm Recording Marks on a Crystalline Organic Thin Film by a Scanning Tunneling Microscope", Applied Physics Letters, vol. 73, No. 6, Aug. 10, 1998, p. 850-852.

Henisch, H.K. et al., "Switching in Organic Polymer Films" Applied Physics Letters, vol. 24, No. 12, Jun. 15, 1974, p. 589-591.

Bryce, Martin R., "Tetrathiafulvalenes as $\pi$-Electron Donors for Intramolecular Charge-Transfer Materials", Advanced Materials, 1999, 11, No. 1, p. 11-23.

Martin, Nazario et al., "Evidence for Two Separate One-electron Transfer Events in Excited Fulleropyrrolidine Dyads Containing Tetrathiafulvalene (TTF)", J. Phys. Chem. A 2000, 104, p. 4648-4657.

Kolega, Randall et al., "Self-Assembled Monolayers of an Aryl Thiol: Formation, Stability, and Exchange of Adsorbed 2-Naphthalenethiol and Bis (2-naphthyl) Disulfide on Au", Langmuir 1998, vol. 14, pp. 5469-5478.

International Search Report dated Sep. 24, 2004, issued in PCT/US05/16741.

Bachtold, Adrian et al., "Logic Circuits with Carbon Nanotube Transistors", Science, vol. 294, Nov. 9, 2001, pp. 1317-1320.

Duan, Xiangfeng et al., "Indium Phosphide Nanowires as Building Blocks for Nanoscale Electronic and Optoelectronic Devices", Nature, vol. 49, Jan. 4, 2001, pp. 66-69.

Gudiksen, Mark S. et al., "Growth of Nanowire Superlattice Structures for Nanoscale Photonics and Electronics", Nature, vol. 415, Feb. 7, 2002, pp. 617-620.

Huynh, Wendy U. et al., "Hybrid Nanorod-Polymer Solar Cells", Science, vol. 295, Mar. 29, 2002, pp. 2425-2427.

Adams, David M. et al., "Charge Transfer on the Nanoscale: Current Status", J. Phys. Chem. B., 2003, vol. 107, No. 28, pp. 6668-6697.

Kamat, Prashant V. et al., "Electrochemical Modulation of Fluorophore Emission on a Nanostructured Gold Film", Angew. Chem. Int. Ed. 2002, vol. 41, No. 15, pp. 2764-2767.

Chen, Shaowei et al., "Gold Nanoelectrodes of Varied Size: Transition to Molecule-Like Charging", Science, vol. 280, Jun. 26, 1998, pp. 2098-2101.

Wuelfing, W. Peter et al., "Electronic Conductivity of Solid-State, Mixed-Valent, Monolayer-Protected Au Clusters", J. Am. Chem. Soc. 2000, vol. 122, No. 46, pp. 11465-11472.

Ouyang, Jianyong et al., "Programmable Polymer Thin Film and Non-Volatile Memory Device", Nature Publishing Group, Nature Materials, vol. 3, Dec. 2004, pp. 918-922.

Hostetler, Michael J. et al., "Alkanethiolate Gold Cluster Molecules with Core Diameters from 1.5 to 5.2 nm: Core and Monolayer Properties as a Function of Core Size", Langmuir, 1998, vol. 14, No. 1, pp. 17-30.

Ouyang, Jianyong et al., "Electric-Field-Induced Charge Transfer Between Gold Nanoparticle and Capping 2-Naphthalenethiol and Organic Memory Cells", Applied Physics Letters, 86, 2005, pp. 123507-1 to 123507-3.

(a)

(b)

(a)

(b)

BISTABLE NANOPARTICLE-POLYMER COMPOSITE FOR USE IN MEMORY DEVICES

CROSS-REFERENCE TO RELATED APPLICATION

This application claims priority to International Application No. PCT/US2005/016741, filed May 12, 2005 and U.S. Provisional Application No. 60/572,145, filed May 17, 2004, the entire contents of which are incorporated herein by reference.

BACKGROUND OF THE INVENTION

1. Field of the Invention

The present invention relates generally to electrically bistable materials that can be converted from a low conductance (electrically off) state to a high conductance (electrically on) state by application of an electrical field to the material. More particularly, the present invention is directed to bistable materials that are composed of a polymer matrix in which nanoparticles are dispersed to provide the polymer with the desired bistable properties.

2. Description of Related Art

The publications and other reference materials referred to herein to describe the background of the invention and to provide additional details regarding its practice are hereby incorporated by reference. For convenience, the reference materials are numerically referenced and identified in the appended bibliography.

Nanometer materials exhibit peculiar electrical, optical and magnetic properties that are different from bulk materials and atoms [1-4]. The electronic materials in nanometer size are especially interesting due to the quantum effect of the electron. New phenomena have been observed on the nanometer materials, such as "Coulombic blockage", surface-enhanced Raman signal, and size-determined energy gap. Charge transfer related the metal nanoparticle has gained much attention [5-8]. It was observed that metal nanoparticles can be charged positively or negatively. Charge transfer was observed on metal nanoparticles through electrochemical methods. Photo-induced charge transfer was also observed between the metal nanoparticle and the capped molecule or surrounding molecule.

Recently, we discovered that there is an electric-field induced charge transfer between gold (Au) nanoparticles capped with dodecanethiol and 8-hydroxyquinoline in a polymer film. [9] This electric-field induced charge transfer results in the formation of the film into two stable conductivity states. This electrically bistable film has very strong application potential as nonvolatile electronic memory. Our further effort was to study effect of the capped molecule on the electric-field induced charge transfer. The device with a polymer film containing 2-naphthalene-capped Au nanoparticles sandwiched between two aluminum (Al) electrodes exhibits an electrical transition to a high conductivity state under a high electric field. This device can be used as write-once-read-many electronic memory [11].

SUMMARY OF THE INVENTION

In accordance with the present invention, it was discovered that a polymer matrix that contains the appropriate amount of capped nanoparticles provides a bistable body that can be used in a wide variety of bistable devices. The capped nanoparticles, which are dispersed in the polymer matrix, include metal nanoparticles that are coated with aromatic thiol molecules.

The present invention covers electrically bistable bodies that are intended for use in electronic devices wherein the bistable body is converted from a low conductance state to a high conductance state by application of an appropriate electrical potential. The bistable body is composed of a polymer matrix in which a sufficient amount of capped nanoparticles are dispersed to provide a material which is electrically convertible from the low conductance state to the high conductance state. As a feature of the present invention the capped nanoparticles are composed of metal nanoparticles that have a surface on which is located a coating of aromatic thiol molecules.

The present invention not only covers the bistable body, but also any of the many bistable devices in which the bistable body is used, such as memory devices.

The invention is based on the discovery that an electric-field induced electrical transition was observed on a device with a polystyrene film containing 2-naphthalenethiol-capped Au nanoparticles sandwiched between two Al electrodes. Before the electrical transition the device exhibited a very low current controlled by the charge injection from the Al electrode into the polymer film. After the electrical transition the current increased by more than three orders in magnitude at 2V and became space-charge-limited current. An asymmetrical IV curve appeared along the two bias directions. This electrical transition is attributed to an electric-field induced charge transfer between the Au nanoparticle and the capping molecule, 2-naphthalenethiol. The device exhibits very good stability in the high conductivity state after the transition. Hence, this device can be used as write-once-read-many electronic memory (11).

The above discussed and many other features and attendant advantages of the present invention will become better understood by reference to the following detailed description when taken in conjunction with the accompanying drawings.

DETAILED DESCRIPTION OF THE INVENTION

Figure 1:
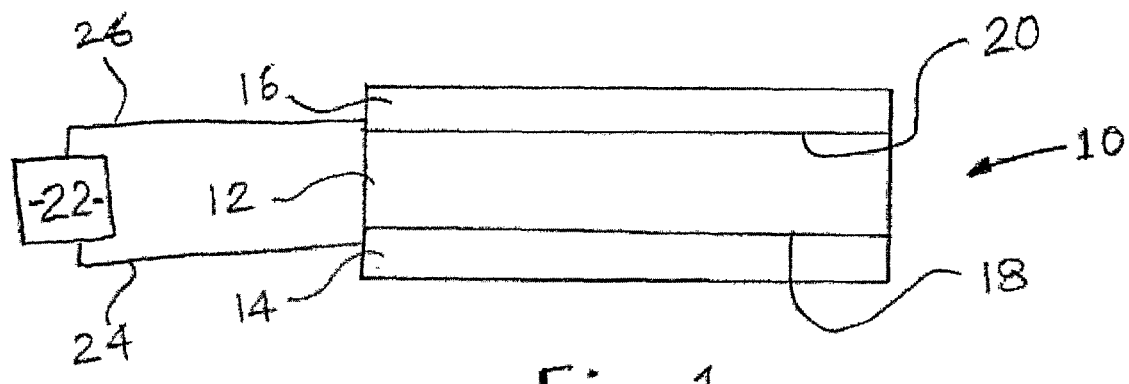
FIG. 1 is a diagrammatic representation of an exemplary bistable device, which includes a bistable body in accordance with the present invention.

A bistable electrical device in accordance with the present invention is shown generally at 10 in FIG. 1. The device 10 includes a bistable body 12 which is sandwiched between a first electrode 14 and a second electrode 16. The bistable body 12 is shown in the form of a layer. However, it will be understood that the bistable body can be provided in any number of different shapes. Bistable bodies in the form of a thin layer or film are preferred since fabrication techniques for forming thin films are well known.

The bistable body 12 includes a first surface 18 which defines a first electrode location on which the first electrode 14 is attached. A second surface 20 is located on the other side of the bistable body 12. This second surface 20 defines a second electrode location on which the second electrode 16 is attached.

The bistable electrical device 10 is connected to an electronic control unit 22 via electrical connections 24 and 26. The control unit 22 is capable of providing an electrical voltage bias across the bistable body 12 via the two electrodes 14 and 16 to convert the bistable body between low resistance and high resistance states. In addition, the control unit is capable of, among other things, measuring current to determine the electrical resistance of the bistable body.

Aluminum (Al) is the preferred electrode material. In addition to Al, the electrode can be made from other metals or conductive oxides (like indium tin oxide) that are known for use as electrode materials.

The nanoparticles, which are capped with the aromatic thiol molecules to form the "capped nanopartilces", may be made from metal and metal alloys of Au, Pt, Ag and the like. The particles have sizes that are preferably on the order of 10 nm or less. Larger particles may be used if desired. However, as the particle size increases, it becomes more difficult to dissolve the particles in organic solvents.

Polystyrene films are preferred as the polymer matrix. However, other polymers may be used including poly(methylmethacrylate), poly(vinyl pyridine) and the like. The preferred concentration of capped nanoparticles in the polymer matrix ranges from 0.05 to 1.2% by weight in solution, which is equivalent to 4 to 50 weight percent in the resulting polymer film. Concentrations of capped nanoparticles outside this range may be used, if desired provided that the desired transition is still achieved. The thickness of the film (polymer matrix) will typically range from 20 to 100 nm.

2-naphthalenethiol is the preferred molecule for capping the nanoparticles. However, other aromatic thiol molecules may be used in place of 2-naphthalenethiol. For example, 2-benzeneethanethiol may be used in place of 2-naphthalenethiol, but it does not work quite as well. The capping molecules can be any molecules with a thiol group (or disulfide and others, which can form a S—Au bond on Au and other metal nanoparticles) and a conjugated ring moiety. The following is a list of exemplary capping molecules: 2-naphthalenethiol, 1-naphthalenethiol, benzenethiol, 2-methylbenzenethiol, 3-methylbenzenethiol, 4-methylbenzenethiol, 2-mercaptophenol, 4-mercaptophenol, 2-aminothiophenol, 3-aminothiophenol, 4-aminothiophenol, 2-benzeneethanethiol, anthracenethiol, pyrenethiol, 2,3-benzanthracenethiol, chrysenethiol, pentacenethiol, p-mercaptopyridine, m-mercaptopyridine, o-mercaptopyridine, ferrocenethiol, phthalocyanethiol.

The nanoparticles are coated with the aromatic thiol molecules according to known procedures (9,10) to form the capped nanoparticles. For example, 0.62 g $HAuCl_4.3H_2O$ was dissolved in 50 ml water and mixed with 160 ml p-xylene solution of 3 g tetraoctylammonium bromide. The organic phase was isolated and 0.28 g 2-naphthalenethiol was added. The formation of the Au nanoparticles was completed by adding 50 ml aqueous solution of 0.76 g $NaBH_4$ dropwisely into the organic solution under vigorous stirring. The Au nanoparticles were purified by washing with 300 ml methanol for at least three times.

It is preferred that the entire surface of the nanoparticle be substantially covered with a monolayer of aromatic thiol molecules. However, the surface does not have to be completely covered, so long as the desired bistable effect is still obtained. The exact amount of surface coverage required to obtain capped nanoparticles that may be used in accordance with the present invention can be determined by routine experimentation. Conversely, the upper limit of coating thickness may also be determined by routine experimentation.

In the following example, 2-naphthalenethiol capped Au nanoparticles (Au-2NT NPs) were prepared by the two-phase arrested method [10]. The surface of the nanoparticle was substantially covered with a monolayer of 2-naphthalenethiol molecules. The device, which has a device structure as shown in FIG. 1, was fabricated using the following process. At first, the bottom Al electrodes were deposited on the glass substrates by the thermal evaporation in vacuum of about $1 \times 10^5$ Torr. Then, the active film was formed by spin-coating 1,2-dichlorobenzenic solution of 1.2% by weight polystyrene and 0.4% by weight Au-2NT NPs. This film has a thickness of about 50 nm. Finally the top Al electrodes were deposited perpendicular to the bottom electrodes. The top and bottom Al electrodes have a line width of 0.2 mm. Al/Au-2NT NPs+PS/Al is used to represent this device. I-V curves were tested using HP 4155 semiconductor analyzer in vacuum or in air. The geometry of 2-naphthalenethiol was optimized with semi-empirical AM1 and HOMO-LUMO energies were calculated with DFT B3LYP/6-31 $G^+$ (d, p).

Figure 2:
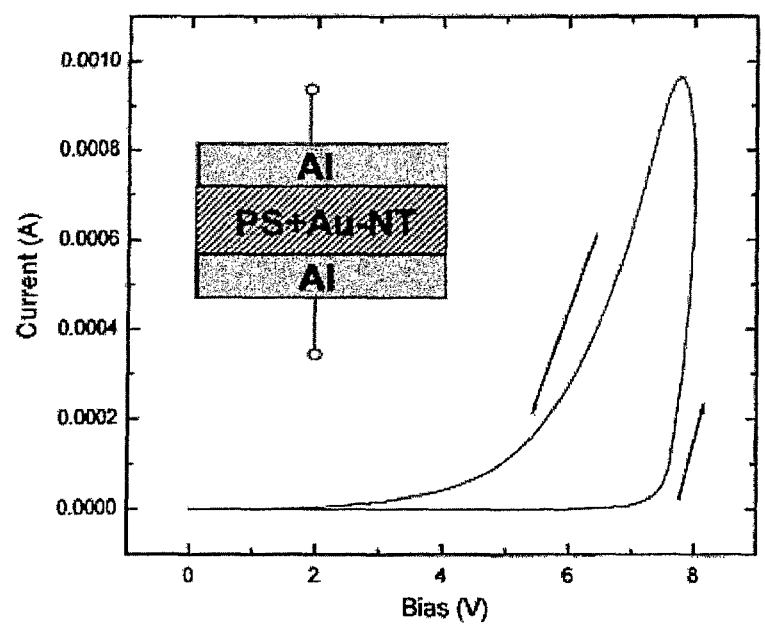
FIG. 2 is an I-V curve of Al/PS+Au—NT/Al. The arrows indicate the bias-scanning directions and the structure under test is shown in the insert.

The IV curve of this device is shown in FIG. 2. The device exhibited a very low current in the low voltage range at the first scan. The current is in the range of 0.1 nanoampere (nA) at 2V. An electrical transition occurred under a high electric field. A rapid increase of the current took place at voltage higher than 7 volt. Hysteria of current was observed during the subsequent scan and the current at the second scan is much higher than at the first scan. The current at 2V at the second scan is higher than at the first scan by more than three orders in magnitude.

After this device transited to the high conductivity state, applying a negative bias cannot return the device to the low conductivity state. This is different from our previous electrical bistable device using dedecanethiol capped Au nanoparticles and 8-hydroxyquinoline [10], which can be returned to the low conductivity state after applying a negative bias. Accordingly, the present device is useful in write-once-read-many electronic memory systems.

This transition was observed in air or in vacuum, so that water and oxygen should be excluded from the possible reason for the transition. This transition can occur only at a high voltage. Applying a low voltage, such as 1 V on the device for a long time cannot lead to this transition. Furthermore, the threshold voltage for the transition increases with the increase of the film thickness. These results suggest that the transition is induced by a high electric field. The current in the two conductivity states increases with the increase of the Au-2NT NP concentration, and the addition of 8-hydroxyquinoline into the film does not affect the current. These indicate that the Au-2NT NPs are the media for the conduction. Therefore, this electric transition under a high electric field is due to an electric-field induced change on the electronic structure of the Au-2NT NPs.

Figure 3:
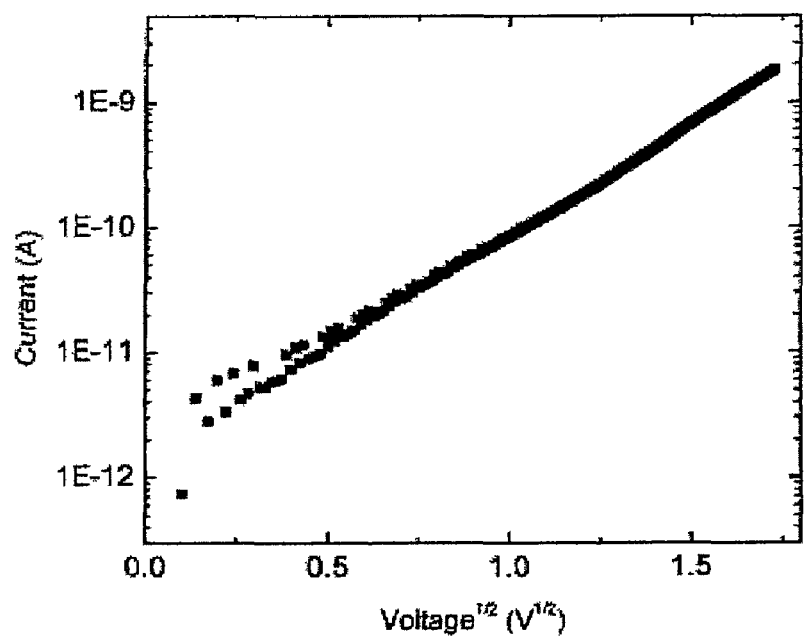
FIG. 3 a graph of $\log I$-$V^{1/2}$ (a) and $\log I$-$\log V$ (b) of the device Al/PS+Au—NT/Al before (a) and after (b) the electrical transition.
Figure 3:
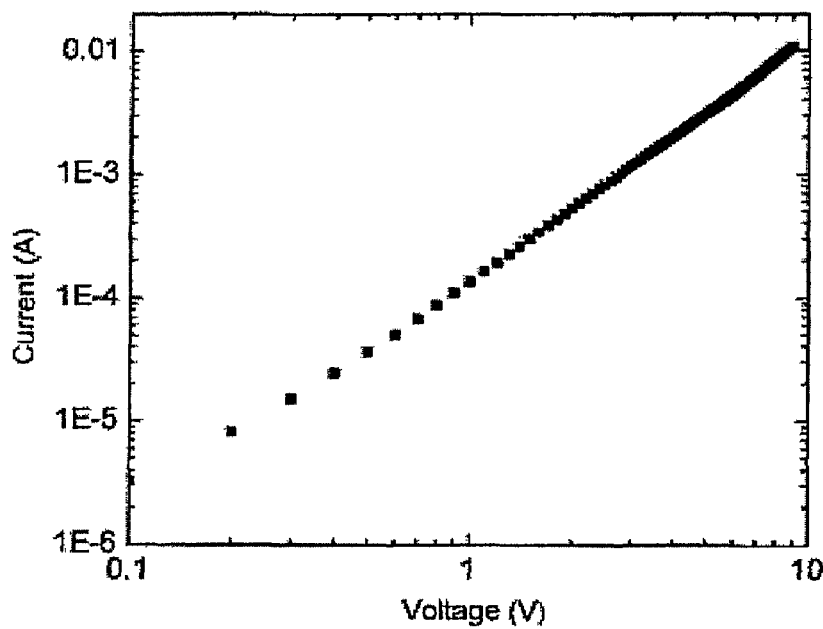

To explain this electric-field induced transition, we studied the conduction mechanism in the two states by analyzing the current-voltage relation. Before the electrical transition, there is a linear relation between logI (I: current) and $V^{1/2}$ (V: voltage) in the voltage range of 0 to 3 V. (FIG. 3a). This suggests that this current is controlled by the charge injection from the electrode into the Au-2NT NPs. After the electrical transition. The current-voltage relation changed: there is a linear relation between logI and logV (FIG. 3b). A best fitting of this logI-logV behavior suggests that $I \propto V^{1.9}$, which indicates a space-charge limited current (SCLC). Therefore, the electrical transition results in a current change from a charge-injection limited current to a charge-transport limited current. The low and high conductivity state of the device is called CI and CT states in this specification, respectively.

Figure 4:
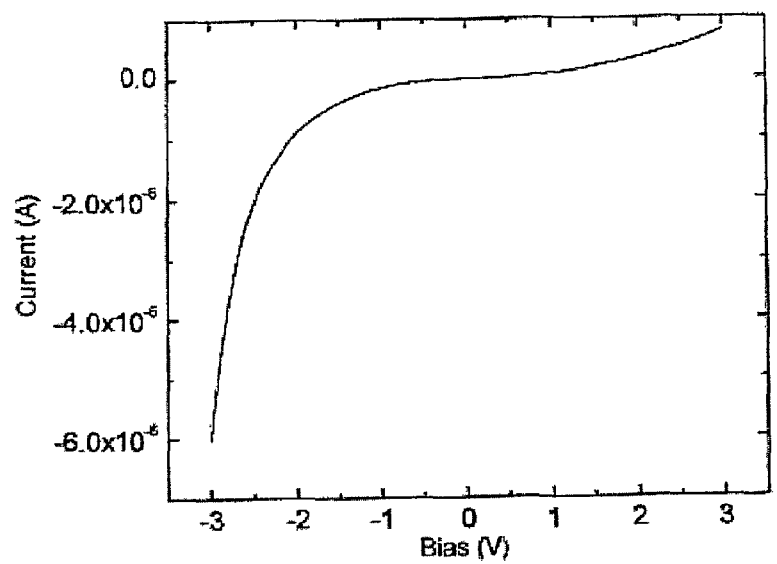
FIG. 4 is an asymmetrical IV curve for Al/PS+Au—NT/Al after the electrical transition.

The current was symmetrical in the two-biased direction in the voltage less than 3V for the device in the CI state. It turned into asymmetrical in the CT state. When the biased direction, which leads to the electrical transition, is defined as the positive bias direction, the current along the negative biased direction is higher than during the positive bias scan. (FIG. 4) The current at −3 V reaches almost ten times as that at 3V. This asymmetrical IV curve for the device in the CT state suggests that the electric field may induce polarization on Au-2NT NPs.

We propose a model for the polarization on the metal nanoparticles. A charge transfer between the Au nanoparticle and the capped 2-naphthalenethiol along the electric field was induced by a high electric field. (FIG. 5a) This charge transfer results in a polarization against the external electric field which induced the transition. Hence, the device exhibits higher current when the external electric field is applied along this polarization direction than when the external electric field is applied against this polarization.

Figure 5:
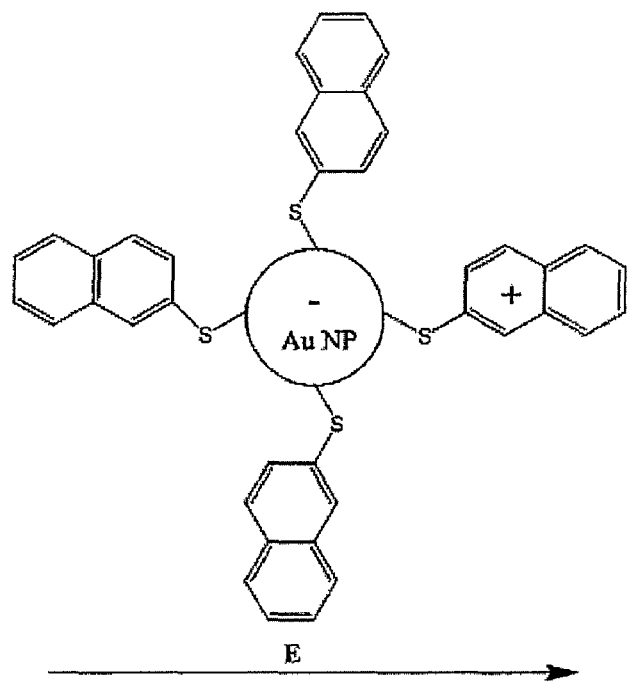
FIG. 5(a) is a schematic representation of charge transfer from 2-naphthalenethiol to Au nanoparticle under electric field E. The arrow indicates the direction of the electric field E.
FIG. 5(b) is a schematic representation of the energy band structure and charge injection from Al into 2-naphthalenethiol before (left) and after (right) electrical transition. The dots on the HOMO represent the electrons.
Figure 5:
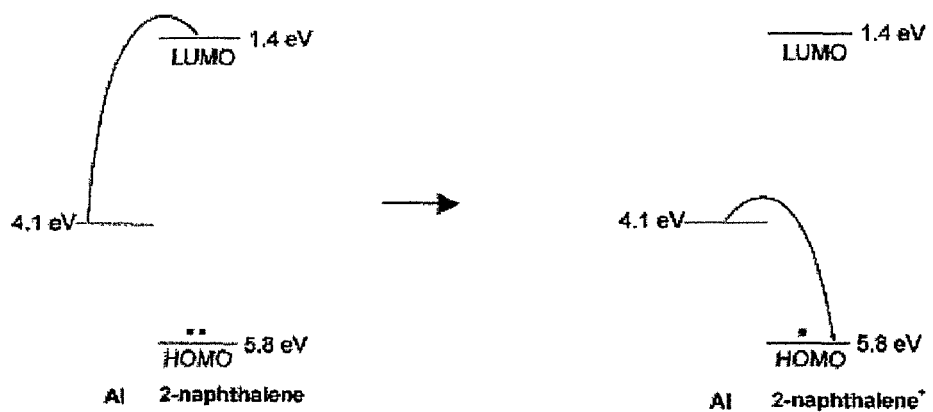

The above-proposed model can also explain the two conductivity states of the device very well. FIG. 5b is the energy diagram of the work function (4.1 eV) of the Al electrode and the highest occupied molecular orbital (HOMO) (HOMO) (5.8 eV) and the lowest unoccupied molecular orbital (LUMO) (1.4 eV) levels of 2NT. When 2NT is not charged, there is a high-energy barrier in the interface between the Al electrode and 2NT. This is why the device has a very low current controlled by the charge injection in the CI state After an electric-field induced charge transfer, 2NT is charged so that the energy barrier for the charge injection from Al electrode into the film disappears. We do not know whether 2NT is positively or negatively charged after the charge transfer. But in both cases, the energy barrier for charge injection will disappear. For example, when 2NT is positively charged after the charge transfer, that is, an electron transfers from HOMO of 2NT to the Au nanoparticle, the electron can be readily injected into the HOMO level of 2NT. Consequently, the current is not controlled by the charge injection but by the charge transport in the film.

Figure 6:
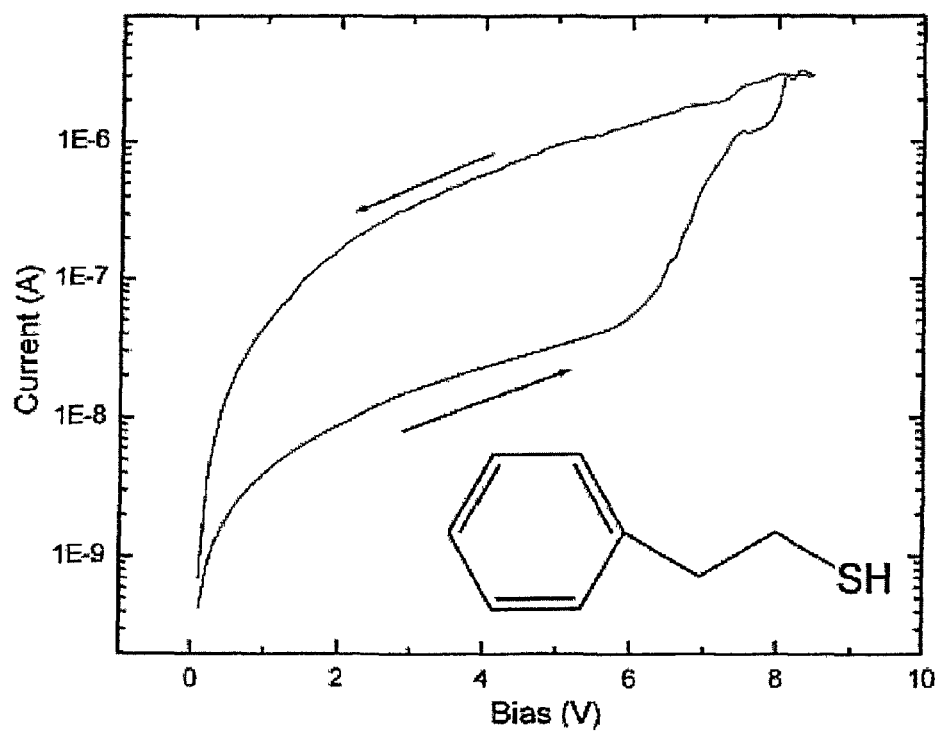
FIG. 6 is a graph of the IV curve of and exemplary device Al/Au—BET+PS/Al. The inset is the chemical structure of 2-benzeneethanethiol (BET).

This electric-field induced transition was observed when the Au-2NT NPs were replaced by the 2-benzeneethanethiol (BET) capped Au nanoparticles. (FIG. 6). The BET capped Au nanoparticles where made in the same manner as the 2NT capped Au nanoparticles and the bistable body (polymer film) was also made in the same manner. The current in the two states is different by less than two orders in magnitude. Hence, this electrical transition is related to the capped molecule on the Au nanoparticles.

Figure 7:
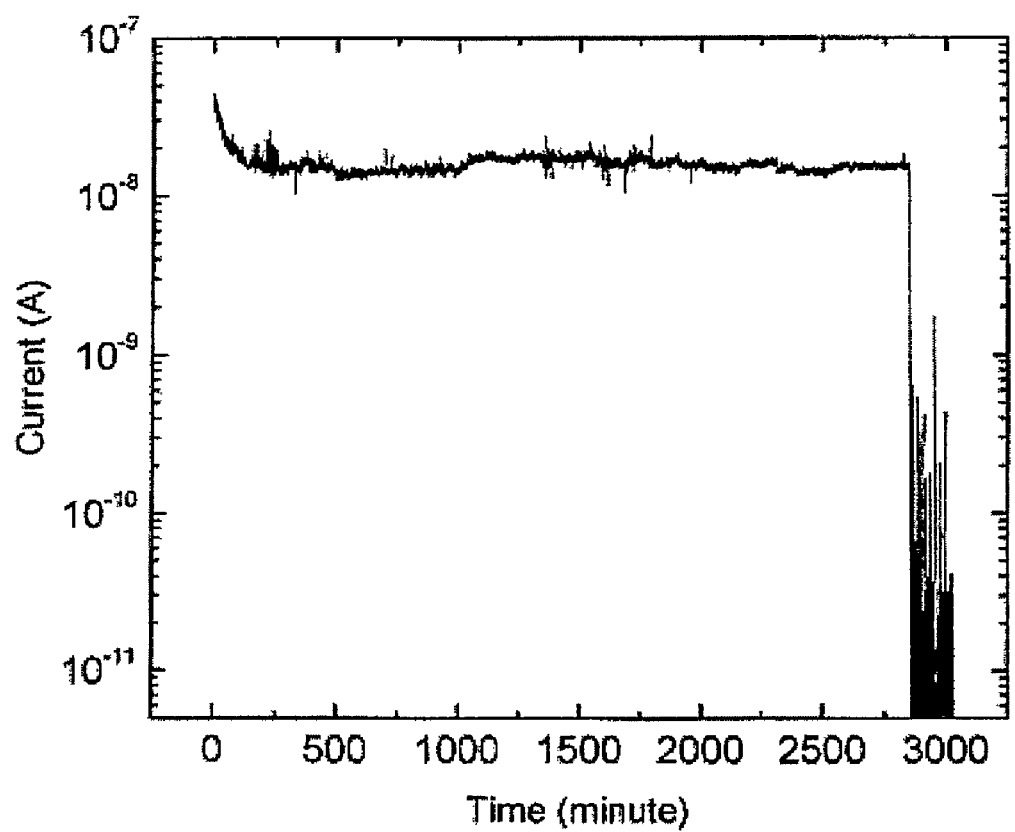
FIG. 7 a graph showing the results of a stress test of an exemplary device in the charge-transport-dominant state at a voltage of 1V.

The Au-2NT NP device exhibits very good stability in the CT state. FIG. 7 depicts the results of a stress test of the device at 1V after the electronic transition. At the beginning, the current decreases but then becomes stable. This initial experiment indicates that the device could be stable in this high conductivity state for more than 60 hours in air. This stability should be greatly improved when the conditions are optimized. The electronic transition and the stability of the device in the CT state suggest that this device could be used as write-once-read-many electronic memory.

In conclusion, electric-field induced transition was observed on the device Al/Au-2NT+PS/Al. The device exhibits charge-injection controlled current before the transition and charge-transport controlled current after the transition. An asymmetrical IV curve was observed in the low voltage range along the two biased directions after the transition. This electrical transition is interpreted as resulting from the electric-field induced charge transfer between the Au nanoparticle and the capping molecule 2NT.

It should be noted that FIG. 5(a) is a diagrammatic representation showing an Au nanoparticle capped with four 2-naphthalenethiols. Actually, as mentioned above, the whole surface of the Au nanoparticle is coated with a monolayer of 2-naphthalenthiols.

Having thus described exemplary embodiments of the present invention, it should be noted by those skilled in the art that the within disclosures are exemplary only and that various other alternatives, adaptations and modifications may be made within the scope of the present invention.

BIBLIOGRAPHY

[1] A. Bachtold, P. Hadley, T. Nakanishi, C. Dekker, Science, 294, 1317 (2001).
[2] X. Duan, Y. Huang, Y. Cui, J. Wang, C. M. Lieber, Nature, 409 (2001) 66."
[3] M. S. Gudiksen, L. J. Lauhon, J. Wang, D. C. Smith, C. M. Lieber, Nature, 415 (2002) 617.
[4] W. U. Huynh, J. J. Dittmer, A. P. Alivisatos, Science, 295 (2002) 2425.
[5] D. M. Adams, L. Brus, C. E. D. Chidsey, S. Creager, C. Creutz, C. R. Kagan, P. V. Kamat, M. Lieberman, S. Lindsay, R. A. Marcus, R. M. Metzger, M. E. M.-Beyerle, J. R. Miller, M. D. Newton, D. R. Rolison, O. Sankey, K. S. Schanze, J. Yardley, X. Zhu, J. Phys. Chem. B, 107 (2003) 6668.
[6] P. V. Kamat, S. Barazzouk, S. Hotchandani, Angew. Chem. Int. Ed., 41 (2002) 2764.
[7] S. Chen, R. S. Ingram, M. J. Hostetler, J. J. Pietron, R. W. Murray, T. G. Schaaff, J. T. Khoury, M. M. Alvarez, R. L. Whetten, Science 280, (1998) 2098.
[8] W. P. Wuelfing, S. J. Green, J. J. Pietron, D. E. Cliffel, R. W. Murray, J. Am. Chem. Soc. 122 (2000) 11465.
[9] J. Ouyang, C. Chu, C. Szmanda, L. Ma, Y. Yang, Nature Materials, 3 (2004) 918.
[10] M. J. Hostetler, J. E. Wingate, C. J. Zhong, J. E. Harris, R. W. Vachet, M. R. Clark, J. D. Londono, S. J. Green, J. J. Stokes, G. D. Wignall, G. L. Glish, M. D. Porter, N. D. Evans, and R. W. Murray, Langmuir 14 (1998) 17.
[11] J. Ouyang, C. Chu, D. Sieves, Y. Yang, Applied Physics Letters, 86, 123507 (2005) 86.

What is claimed is:

1. An electrically bistable body for use in electronic devices wherein said bistable body is convertible from a low conductivity state to a high conductivity state, said bistable body comprising a polymer matrix in which a sufficient amount of capped nanoparticles are dispersed to provide said bistable body which is electrically convertible from said low conductivity state to said high conductivity state, said capped nanoparticles comprising gold nanoparticles that have a surface on which is located a coating that comprises 2-naphthalenethiol.

2. An electrically bistable body for use in electronic devices according to claim 1 wherein said polymer matrix comprises a polymer selected from the group consisting of polystyrene, poly(methylmethacrylate) and poly(vinyl pyridine).

3. An electrically bistable body for use in electronic devices according to claim 1 wherein said polymer matrix consists essentially of polystyrene.

4. An electrically bistable body for use in electronic devices according to claim 1 wherein said polymer matrix is from 20 to 100 nm thick.

5. An electrically bistable body for use in an electronic devices according to claim 1 wherein said nanoparticles are 10 nanometers of less in diameter.

6. A bistable electrical device which is convertible between a low conductance state and a high conductance state, said device comprising: a bistable body which is electrically convertible between said low conductance state and said high conductance state, said bistable body comprising a first surface which defines a first electrode location and a second surface which defines a second electrode location, said bistable body comprising a polymer matrix in which a sufficient amount of capped nanoparticles are dispersed to provide said bistable body which is electrically convertible between said low conductance state and said high conductance state, said capped nanoparticles comprising gold nanoparticles that have a surface on which is located a coating that comprises 2-naphthalenethiol; a first electrode attached to said bistable body at said first electrode location; and a second electrode attached to said bistable body at said second electrode location.

7. A bistable device according to claim 6 wherein said polymer matrix comprises a polymer selected from the group consisting of polystyrene, poly(methylmethacrylate) and poly(vinyl pyridine).

8. A bistable electrical device according to claim 6 wherein said polymer matrix consists essentially of polystyrene.

9. A bistable electrical device according to claim 6 wherein said polymer matrix is from 20 to 100 nm thick.

10. A bistable electrical device according to claim 6 wherein said nanoparticles are 10 nanometers of less in diameter.

* * * * *